United States Patent
Nishida

(10) Patent No.: US 7,219,845 B2
(45) Date of Patent: May 22, 2007

(54) ELECTRONIC DEVICE HAVING MULTILAYER PRINTED WIRING BOARD AND METHOD FOR MANUFACTURING ELECTRONIC DEVICE

(75) Inventor: Noboru Nishida, Ome (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 259 days.

(21) Appl. No.: 10/969,861

(22) Filed: Oct. 22, 2004

(65) Prior Publication Data

US 2005/0146858 A1 Jul. 7, 2005

(30) Foreign Application Priority Data

Oct. 29, 2003 (JP) ............................. 2003-369308

(51) Int. Cl.
*G06K 19/06* (2006.01)
(52) U.S. Cl. ........................ 235/492; 235/487
(58) Field of Classification Search ................ 235/482, 235/487, 492, 484, 486
See application file for complete search history.

(56) References Cited

U.S. PATENT DOCUMENTS

| 5,784,259 | A | | 7/1998 | Asakura |
| 5,838,549 | A | * | 11/1998 | Nagata et al. ............... 361/794 |
| 5,995,372 | A | * | 11/1999 | Asakura ...................... 361/737 |
| 6,181,004 | B1 | * | 1/2001 | Koontz et al. ............... 257/691 |
| 6,392,897 | B1 | * | 5/2002 | Nakase et al. ............... 361/785 |

* cited by examiner

*Primary Examiner*—Daniel Stcyr
(74) *Attorney, Agent, or Firm*—Finnegan, Henderson, Farabow, Garrett & Dunner, L.L.P.

(57) ABSTRACT

A card-type electronic device has a multilayer printed wiring board and a case which houses the multilayer printed wiring board. The case has an opening. The multilayer printed wiring board includes a plurality of insulating layers and a plurality of conductive layers, which are alternately stacked, and has a flat surface on one side thereof along a stacked direction. The flat surface is formed of one of the insulating layers, and at least a part of the flat surface is exposed to the outside of the case through the opening.

15 Claims, 3 Drawing Sheets

ELECTRONIC DEVICE HAVING MULTILAYER PRINTED WIRING BOARD AND METHOD FOR MANUFACTURING ELECTRONIC DEVICE

CROSS-REFERENCE TO RELATED APPLICATIONS

This application is based upon and claims the benefit of priority from prior Japanese Patent Application No. 2003-369308, filed Oct. 29, 2003, the entire contents of which are incorporated herein by reference.

BACKGROUND OF THE INVENTION

1. Field of the Invention

The present invention relates to a card-type electronic device such as an SD (Secure Digital) memory card, formed of a flat case and a multilayer printed wiring board housed therein, and also to a method for manufacturing the card-type electronic device.

2. Description of the Related Art

A compact SD memory card including a flash memory is known as a medium to store image data, sound data and other data. The SD memory cards are widely used in mobile devices, for example, cellular phones and PDAs (Personal Digital Assistants).

The SD memory card comprises a multilayer printed wiring board on which a memory element and a controller are mounted, and a flat case which houses the multilayer printed wiring board. The case has a recess portion in which the multilayer printed wiring board is fitted. The recess portion has an opening on the outer surface of the case, and a bottom that faces the opening. The multilayer printed wiring board is exposed to the outside of the case through the opening in the recess portion, and it constitutes a part of the surface of the SD memory card. The memory element and controller are housed in a gap between the multilayer printed wiring board and the bottom of the recess portion.

The multilayer printed wiring board has a plurality of conductive layers and a plurality of insulating layers stacked alternately. One of the conductive layers is located at the surface of the multilayer printed wiring board. Since the conductive layer is exposed to the outside of the case through the opening, if the user touches the conductive layer with a finger, the memory element may fatally damaged by static electricity built up in the human body.

To avoid the above damage, in the conventional SD memory card, the conductive layer located at the surface of the multilayer printed wiring board is coated with a solder resist, so that the memory element is protected from static electricity. For example, U.S. Pat. No. 5,784,259 discloses such an SD memory card.

According to the conventional SD memory card, a solder resist must be applied to the surface of the multilayer printed wiring board in order to protect the memory element from the static electricity. Therefore, in the process of manufacturing a multilayer printed wiring board, a step of applying a solder resist is additionally required, so that the number of steps is increased. As a result, the manufacturing cost for the multilayer printed wiring board is increased, resulting in a high-priced SD memory card.

Further, patterned conductive layers slightly protrude from the insulating layers. Therefore, even if a solder resist is applied to the conductive layer, the conductive layer patterns form irregularities on the surface of the SD memory card. Thus, the SD memory card looks unattractive, so that the value of the product is lowered.

BRIEF SUMMARY OF THE INVENTION

According to one embodiment of the present invention, there is provided a card-type electronic device comprising: a multilayer printed wiring board including a plurality of insulating layers and a plurality of conductive layers, which are alternately stacked, the multilayer printed wiring board having a flat surface on one side thereof along a stacked direction, the flat surface being formed of one of the insulating layers; and a case which houses the multilayer printed wiring board and has an opening that exposes at least a part of the flat surface.

BRIEF DESCRIPTION OF THE SEVERAL VIEWS OF THE DRAWING

The accompanying drawings, which are incorporated in and constitute a part of the specification, illustrate embodiments of the invention, and together with the general description given above and the detailed description of the embodiments given below, serve to explain the principles of the invention.

DETAILED DESCRIPTION OF THE INVENTION

The first embodiment of the present invention will be described with reference to FIGS. 1 to 3.

Figure 1:
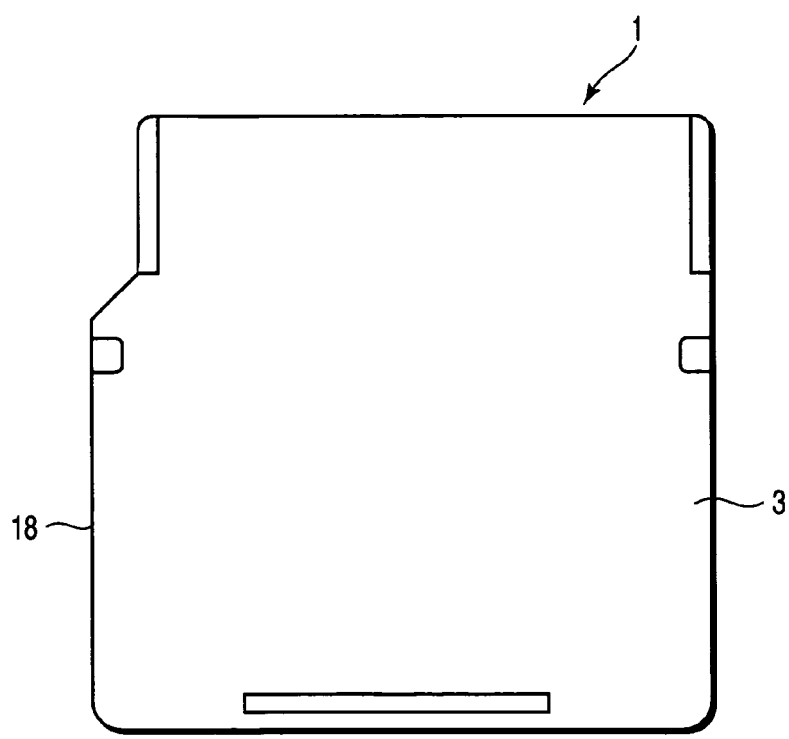
FIG. 1 is a plan view of an SD memory card according to a first embodiment of the present invention.
Figure 2:
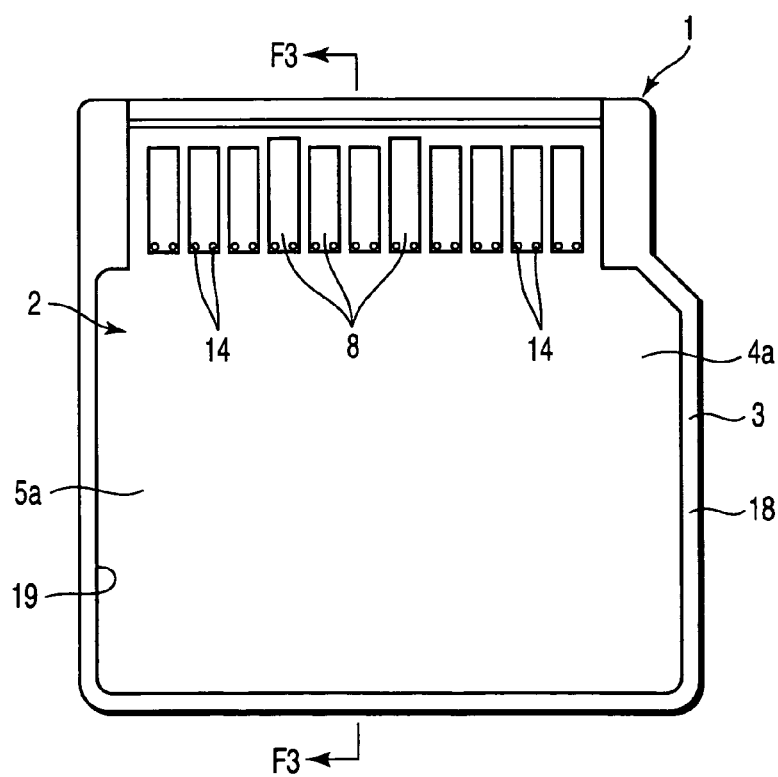
FIG. 2 is a plan view of the SD memory card according to the first embodiment of the present invention, showing the positional relationship between a first surface of a multilayer printed wiring board and contact terminals.

FIGS. 1 and 2 disclose a compact SD memory card 1 as an example of a card-type electronic device. The SD memory card 1 is a medium for storing image data, sound data or the like, and loaded in a mobile device, for example, a cellular phone or a PDA (Personal Digital Assistant) when used.

Figure 3:
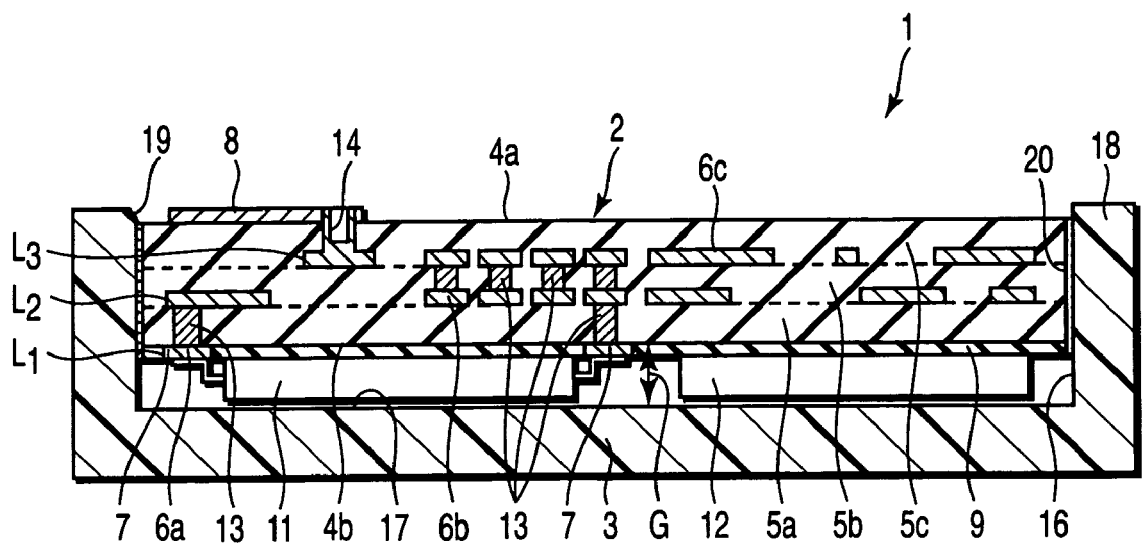
FIG. 3 is a sectional view of the SD memory card taken along the line F3—F3 in FIG. 2.

As shown in FIG. 3, the SD memory card 1 comprises a multilayer printed wiring board 2, and a flat case 3 made of synthetic resin which houses the multilayer printed wiring board 2. The multilayer printed wiring board 2 has a plurality of insulating layers 5a, 5b and 5c and a plurality-of conductive layers 6a, 6b and 6c. The insulating layers 5a, 5b and 5c and the conductive layers 6a, 6b and 6c are stacked alternately in the thickness direction of the multilayer printed wiring board 2. The multilayer printed wiring board 2 has a first surface 4a and a second surface 4b. The first surface 4a is located on one side in the stacked direction (thickness direction) of the multilayer printed wiring board 2. The second surface 4b is located on the opposite side from the first surface 4a.

The insulating layers 5a, 5b and 5c are made of non-transparent synthetic resin material, such as epoxy resin. The conductive layers 6a, 6b and 6c are made of, for example, copper foil. The conductive layers 6a, 6b and 6c have patterns of predetermined shapes.

As shown in FIG. 3, the conductive layer 6a of a first layer L1 is situated on the second surface 4b of the multilayer printed wiring board 2, and has a plurality of lands 7. The conductive layer 6b of a second layer L2 is situated between the insulating layers 5a and 5b. The conductive layer 6c of a third layer L3 is situated between the insulating layers 5b and 5c. Thus, the first surface 4a of the multilayer printed wiring board 2 is formed by the single insulating layer 5c, and therefore it is a flat surface having no irregularities.

A plurality of connection terminals 8 are arranged on the first surface 4a of the multilayer printed wiring board 2. The connection terminals 8 are made of, for example, copper foil, and serve as an input/output interface when the SD memory card 1 is loaded in the mobile device. The connection terminals 8 are located on an end portion of the first surface 4a and aligned with one another along the width direction of the SD memory card 1.

The second surface 4b of the multilayer printed wiring board 2 is covered with a solder resist 9. The solder resist 9 covers that portion of the conductive layer 6a on the second surface 4b, which excludes the lands 7. A plurality of circuit components 11 and 12, such as a memory element and a controller, are mounted on the second surface 4b of the multilayer printed wiring board 2. The circuit elements 11 and 12 are soldered to the lands 7 of the conductive layer 6a.

The conductive layers 6a, 6b and 6c are electrically connected to one another through a plurality of filled vias 13. The filled vias 13 are formed only in the insulating layers 5a and 5b, and situated between the adjacent two of the conductive layers 6a, 6b and 6c to be connected, without penetrating the multilayer printed wiring board 2 in the thickness direction.

The connection terminals 8 of the multilayer printed wiring board 2 are electrically connected to the conductive layer 6c of the third layer L3 through a plurality of conformal vias 14. The conformal vias 14 are formed only in the insulating layer 5c, and situated between the conductive layer 6c and the connection terminal 8 to be connected, without penetrating the multilayer printed wiring board 2 in the thickness direction.

The multilayer printed wiring board 2 of the above structure is manufactured by a build-up process. An example of the method for manufacturing the multilayer printed wiring boards 2 will be explained.

First, prepreg made of epoxy resin, to form the insulating layer 5a, is prepared. Via holes are formed in the prepreg by, for example, a laser. The via holes are filled with conductive paste, with the result that the filled vias 13 are formed.

Then, copper foil is put over the upper surface and the lower surface of the prepreg. Then, conductive patterns are formed on the copper foil. The copper foil is etched, so that the conductive layer 6a of the first layer L1 and the conductive layer 6b of the second layer L2 are formed. The conductive layers 6a and 6b are electrically connected to each other by the filled vias 13.

Thereafter, prepreg made of epoxy resin, to form the insulating layer 5b, is prepared. Filled vias 13 are formed in the prepreg in the same manner as described above. The prepreg is stacked on the insulating layer 5a on which the conductive layer 6b of the second layer L2 is formed. Further, copper foil is put over the prepreg. Subsequently, a conductive pattern is formed on the copper foil. The copper foil is etched, so that the conductive layer 6c of the third layer L3 is formed. The conductive layer 6c is electrically connected to the conductive layer 6b of the second layer L2 by the filled vias 13.

Then, prepreg made of epoxy resin, to form the insulating layer 5c, is prepared. The prepreg is stacked on the insulating layer 5b on which the conductive layer 6c of the third layer L3 is formed. Further, copper foil is put over the prepreg. Thereafter, via holes are formed in the prepreg, and the copper foil is plated and etched, so that the connection terminals 8 and the conformal vias 14 are formed. The connection terminals 8 are electrically connected to the conductive layer 6c of the third layer L3 by the conformal vias 14. As a result, the multilayer printed wiring board 2, in which the insulating layers 5a, 5b and 5c and the conductive layers 6a, 6b and 6c are stacked alternately, is formed.

Thereafter, the solder resist 9 is applied to the second surface 4b of the multilayer printed wiring board 2. The solder resist 9 covers that portion of the conductive layer 6a of the first layer L1, which excludes the lands 7. Finally, post-processing, such as character printing or exterior finishing, is performed, and thus, a series of processes for manufacturing the multilayer printed wiring board 2 is completed.

The case 3 has a recess portion 16 having a size corresponding to the multilayer printed wiring board 2. The recess portion 16 has a flat bottom 17, a peripheral wall 18 standing upright from the peripheral edge of the bottom 17 and a rectangular opening 19 facing the bottom 17.

The multilayer printed wiring board 2 is placed within the recess portion 16. The second surface 4b of the board 2 faces the bottom 17 of the recess portion 16. There is a gap G between the second surface 4b of the multilayer printed wiring board 2 and the bottom 17 of the recess portion 16. The circuit components 11 and 12 mounted on the second surface 4b are accommodated in the gap G. Thus, the second surface 4b of the multilayer printed wiring board 2 and the circuit components 11 and 12 are concealed by the case 3.

The multilayer printed wiring board 2 is fixed to the peripheral wall 18 of the recess portion 16 by adhesive 20. This fixture causes the multilayer printed wiring board 2 and the case 3 to be integrated, and the first surface 4a of the multilayer printed wiring board 2 and the connection terminals 8 to be exposed to the outside of the case 3 through the opening 19. Thus, the first surface 4a of the multilayer printed wiring board 2 forms a part of the surface of the SD memory card 1.

Procedures for manufacturing the SD memory card 1 will be described below.

First, the multilayer printed wiring board 2 manufactured by the buildup process is prepared. The multilayer printed wiring board 2 is formed by stacking the layers one by one and there is no through hole penetrating all the layers in the thickness direction. Therefore, the first surface 4a and the second surface 4b of the multilayer printed wiring board 2 are flat surfaces, which do not have openings.

Then, the circuit components 11 and 12 are put on the second surface 4b of the multilayer printed wiring board 2, and soldered to the lands 7 of the conductive layer 6a of the first surface L1.

Thereafter, the multilayer printed wiring board 2 is placed within the recess portion 16 of the case 3, and fixed to the peripheral wall 18 by the adhesive 20. This fixture causes circuit components 11 and 12 to be held in the gap G between the bottom 17 of the recess portion 16 and the second surface 4b of the multilayer printed wiring board 2.

At the same time, the opening 19 of the case 3 is closed by the multilayer printed wiring board 2, and the first surface 4a and the connection terminals 8 of the multilayer printed wiring board 2 are exposed to the outside of the case 3 through the opening 19. Thus, a series of processes for manufacturing the SD card 1 is completed.

According to the first embodiment of the present invention described above, the first surface 4a of the multilayer printed wiring board 2, which is exposed through the opening 19 of the case 3, is formed of the single insulating layer 5c except for the connection terminals 8 that serve as an input/output interface. In other words, there is no conductive pattern on the first surface 4a. Therefore, it is unnecessary to apply a solder resist, which protects a conductive pattern or prevents adhesion of solder, to the first surface 4a.

Consequently, the number of steps for manufacturing the multilayer printed wiring board 2 can be reduced, with the result that the manufacturing cost for the multilayer printed wiring board 2 can be reduced. These technical advantages contribute to a drop in price of the SD memory card 1.

Further, it is the insulating layer 5c stacked on the conductive layer 6c of the third layer L3 that is exposed to the outside of the case 3 through the opening 19. The insulating layer 5c is thicker than a solder resist. Therefore, the patterns of the conductive layer 6c do not appear as irregularities on the first surface 4a of the multilayer printed wiring board 2. Thus, the appearance of the first surface 4a is enhanced.

Moreover, the multilayer printed wiring board 2 manufactured by the buildup process does not have a through hole penetrating the multilayer printed wiring board 2 in the thickness direction. Accordingly, the first surface 4a is a flat surface having no hole or recess. Thus, although the insulating layer 5c is exposed to the outside of the case 3, there is no problem in appearance and the SD memory card 1 is improved in quality.

Figure 4:
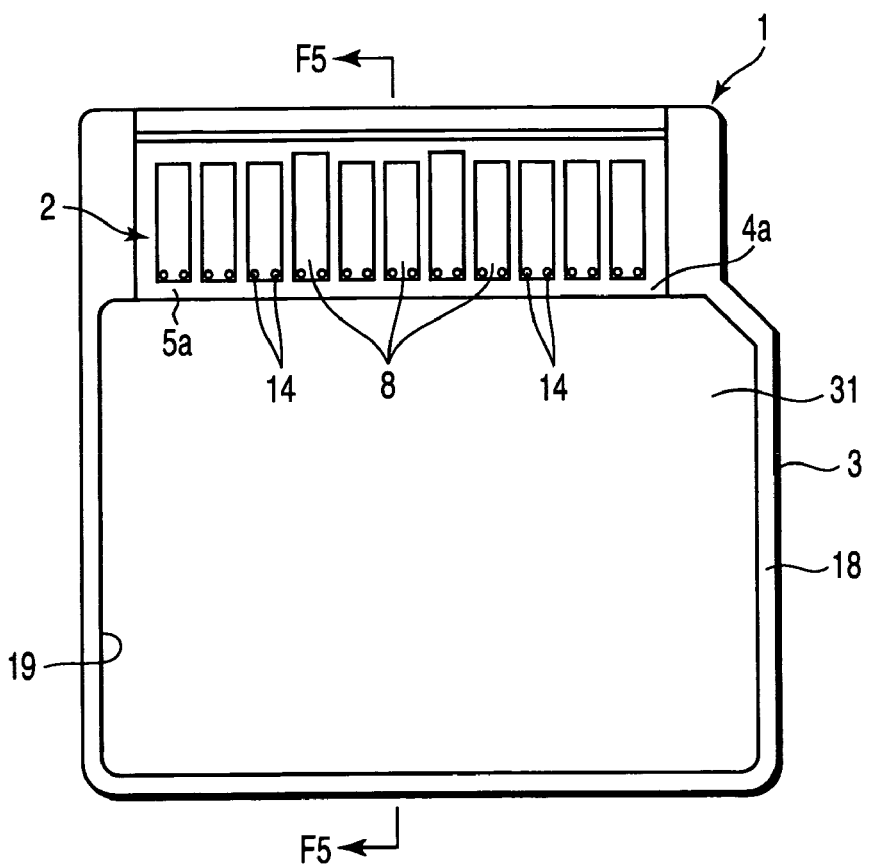
FIG. 4 is a plan view of an SD memory card according to a second embodiment of the present invention.
Figure 5:
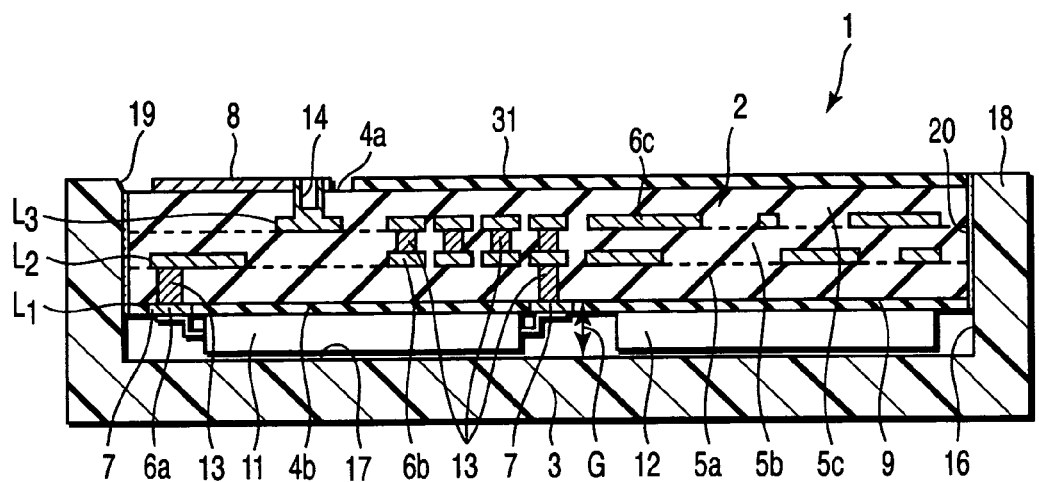
FIG. 5 is a sectional view of the SD memory card taken along the line F5—F5 in FIG. 4.

The present invention is not limited to the first embodiment described above. FIGS. 4 and 5 disclose the second embodiment of the present invention.

The second embodiment is different from the first embodiment in that a solder resist 31 is applied to the first surface 4a of the multilayer printed wiring board 2 that is exposed to the outside of the case 3. The other structure of the SD memory card 1 of this embodiment is the same as that of the first embodiment. Therefore, the same reference numerals are assigned to the same components as those in the first embodiment, and descriptions thereof are omitted.

The solder resist 31 covers the region of the first surface 4a of the multilayer printed wiring board 2 except for the connection terminals 8. The solder resist 31 is colored, for example, non-transparent black, and prevents the first surface 4a of the multilayer printed wiring board 2 from being seen therethrough. Thus, the first surface 4a and the second surface 4b of the multilayer printed wiring board 2 are respectively covered with the solder resists 31 and 9. The adoption of this structure provides the following advantageous effects.

The conductive layers 6a, 6b and 6c made of copper foil are higher in thermal expansion coefficient than the insulating layers 5a, 5b and 5c made of synthetic resin. Therefore, if the temperature is changed during the process of manufacturing the multilayer printed wiring board 2, the conductive layers 6a, 6b and 6c expand or contract greater than the insulating layers 5a, 5b and 5c. If only the second surface 4b of the multilayer printed wiring board 2 is covered with the solder resist 9, the second surface 4b of the multilayer printed wiring board 2 is prevented from expanding and contracting owing to the solder resist 9. As a result, the multilayer printed wiring board 2 is warped.

In contrast, according to this embodiment, since the first surface 4a and the second surface 4b of the multilayer printed wiring board 2 are respectively coated with the solder resists 31 and 9, the two surfaces 4a and 4b are expanded or contracted substantially equally. As a result, the warp of the multilayer printed wiring board 2 due to a change in temperature is suppressed to the minimum, and the flatness of the multilayer printed wiring board 2 is maintained.

Figure 6:
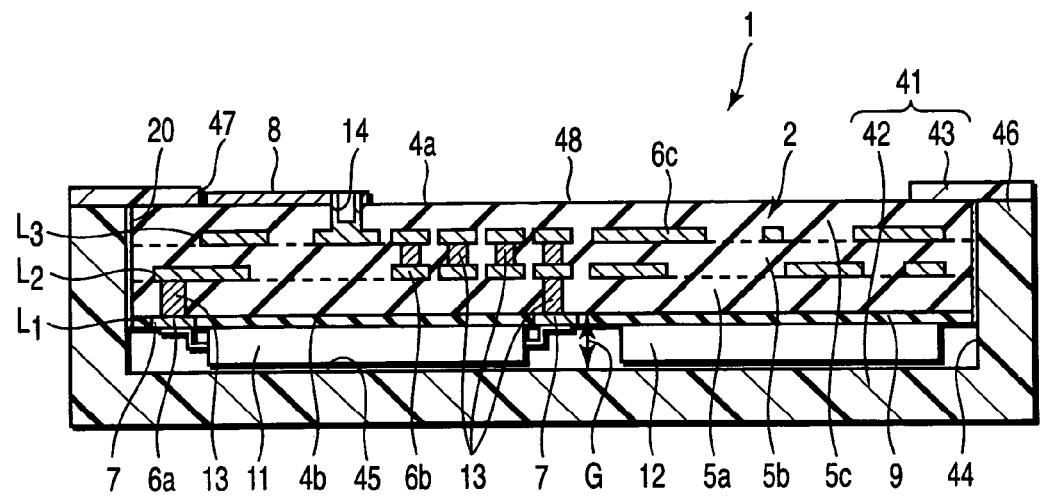
FIG. 6 is a sectional view of an SD memory card according to a third embodiment of the present invention.

FIG. 6 discloses a third embodiment of the present invention.

The third embodiment is different from the first embodiment in structure of a case 41 that houses the multilayer printed wiring board 2. The other structure of the multilayer printed wiring board 2 of this embodiment is the same as that of the first embodiment.

As shown in FIG. 6, the case 41 comprises a case main body 42 and a mask 43. The case main body 42 has a recess portion 44 of a size corresponding to the multilayer printed wiring board 2. The recess portion 44 has a flat bottom 45, a peripheral wall 46 standing upright from the peripheral edge of the bottom 45. The multilayer printed wiring board 2 is fitted in the recess portion 44, and the second surface 4b faces the bottom 45 of the recess portion 44. The circuit components 11 and 12 mounted on the second surface 4b of the multilayer printed wiring board 2 are accommodated in a gap G between the second surface 4b of the multilayer printed wiring board 2 and the bottom 45 of the recess portion 44. Thus, the second surface 4b of the multilayer printed wiring board 2 and the circuit components 11 and 12 are concealed by the case main body 42.

The multilayer printed wiring board 2 is fixed to the peripheral wall 46 of the recess portion 44 by the adhesive 20. This fixture causes the multilayer printed wiring board 2 and the case main body 42 to be integrated.

The mask 43 is fixed to the end face of the peripheral wall 46 of the case main body 42 by means of, for example, welding. The mask 43 has a rectangular opening 47, through which the first surface 4a of the multilayer printed wiring board 2 is exposed. The opening 47 is one size smaller than the first surface 4a of the multilayer printed wiring board 2. Thus, the mask 43 projects over the peripheral portion of the first surface 4a.

The first surface 4a of the multilayer printed wiring board 2 has a rectangular region 48 surrounded by the peripheral portion. The region 48 is exposed to the outside of the case 41 through the opening 47. The connection terminals 8 on the first surface 4a are located in the region 48.

In the structure described above, the region 48 of the first surface 4a of the multilayer printed wiring board 2, which is exposed to the outside of the case 41, is formed on the single insulating layer 5c. Therefore, the region 48 need not be coated with a solder resist, which protects a conductive pattern. Consequently, the number of steps for manufacturing the multilayer printed wiring board 2 can be reduced, with the result that the manufacturing cost for the multilayer printed wiring board 2 can be reduced.

Moreover, the patterns of the conductive layer 6c do not appear as irregularities on the first surface 4a of the multilayer printed wiring board 2. Thus, the appearance of the first surface 4a of the multilayer printed wiring board 2 is enhanced and the quality of the SD memory card 1 is improved.

Figure 7:
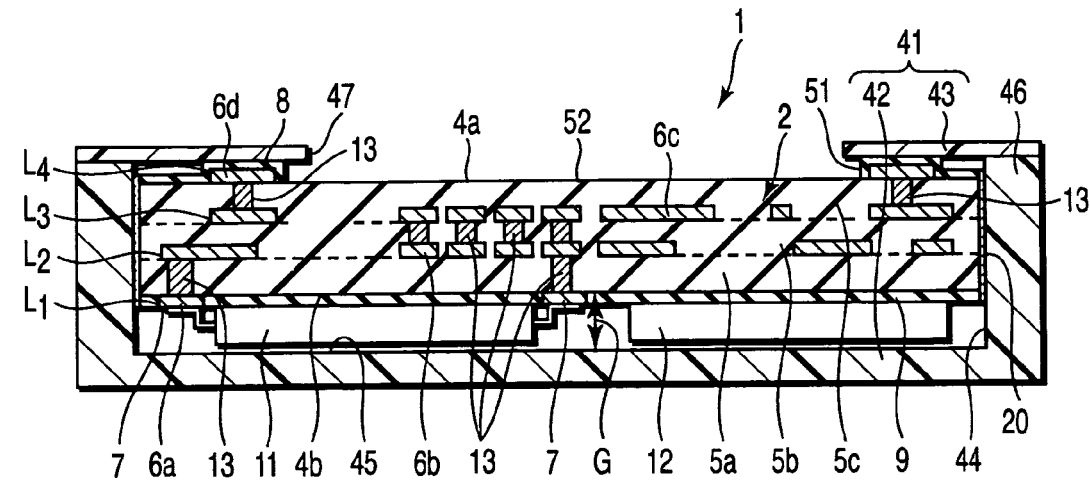
FIG. 7 is a sectional view of an SD memory card according to a fourth embodiment of the present invention.

FIG. 7 discloses a fourth embodiment of the present invention.

The fourth embodiment is a further improvement of the third embodiment.

As shown in FIG. 7, the multilayer printed wiring board 2 has a conductive layer 6d of a fourth layer L4. The conductive layer 6d has a pattern of a predetermined shape, and is located in the peripheral portion of the first surface 4a of the multilayer printed wiring board 2. The conductive layer 6d is electrically connected to the conductive layer 6c of the third layer L3 by the filled vias 13 formed in the insulating layer 5c.

A solder resist 51 is applied to the peripheral portion of the first surface 4a. The solder resist 51 covers the conductive layer 6d of the fourth layer L4. The first surface 4a of the multilayer printed wiring board 2 has a rectangular region 52 surrounded by the solder resist 51. The region 52 of the first surface 4a is a flat surface formed of the single insulating layer 5c.

Further, the solder resist 51 is covered by the mask 43 of the case 41. Therefore, the region 52 of the first surface 4a is exposed to the outside of the case 41 through the opening 47 of the mask 43.

In the structure described above, the conductive layer 6d at the first surface 4a of the multilayer printed wiring board 2 is concealed by the mask 43 of the case 41. In addition, the region 52 of the first surface 4a, which is exposed to the outside of the case 41, is formed of the single insulating layer 5c.

Therefore, the patterns of the conductive layer 6d do not appear as irregularities on the region 52 of the first surface 4a. Thus, the appearance of the SD memory card 1 is enhanced.

The card-type electronic device, to which the present invention is applied, is not limited to the SD memory card. For example, the present invention can also be applied to an IC card or a PC card.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. An electronic device comprising:
a multilayer printed wiring board including a plurality of insulating layers and a plurality of conductive layers, which are alternately stacked, the multilayer printed wiring board comprising:
a flat surface located on one side of the multilayer printed wiring board along a stacked direction, the flat surface being formed of one of the insulating layers, the flat surface having a plurality of connection terminals arranged thereon, the connection terminals being electrically connected to the conductive layers; and
an opposite surface located on the multilayer printed wiring board opposite to the flat surface, the opposite surface having a plurality of circuit components mounted thereon; and
a case which houses the multilayer printed wiring board, the case including an opening which permits at least a part of the flat surface to be exposed from the case, thereby exposing the connection terminals.

2. The electronic device according to claim 1, wherein the case includes a recess portion which houses the multilayer printed wiring board, the recess portion has a bottom facing the opposite surface of the multilayer printed wiring board, and the circuit components are interposed between the bottom and the other surface.

3. The electronic device according to claim 1, further comprising a via electrically connecting adjacent two of the conductive layers with an insulating layer interposed therebetween, the via being situated between the conductive layers to be connected without penetrating through the multilayer printed wiring board.

4. The electronic device according to claim 1, wherein the multilayer printed wiring board is formed by a build-up process, in which the insulating layers and the conductive layers are alternately stacked one by one.

5. An electronic device comprising:
a multilayer printed wiring board including a plurality of insulating layers and a plurality of conductive layers, which are alternately stacked, the multilayer printed wiring board having a flat surface on one side thereof along a stacked direction, the flat surface being formed of one of the insulating layers;
a plurality of connection terminals arranged on the flat surface and electrically connected to the conductive layers; and
a case which houses the multilayer printed wiring board, the case including: a case main body having a recess portion which houses the multilayer printed wiring board; and a mask connected to the case main body, the mask having an opening which exposes the connection terminals and the flat surface.

6. The electronic device according to claim 5, wherein the multilayer printed wiring board has another surface which is located on an opposite side from the flat surface and on which a plurality of circuit components are mounted, the recess portion of the case main body has a bottom facing the other surface of the multilayer printed wiring board, and the circuit components are interposed between the bottom and the other surface.

7. The electronic device according to claim 5, wherein the opening of the mask is smaller than the flat surface of the multilayer printed wiring board.

8. An electronic device comprising:
a multilayer printed wiring board including a plurality of insulating layers and a plurality of conductive layers, which are alternately stacked, the multilayer printed wiring board having a first surface on one side thereof along a stacked direction and a second surface located on an opposite side from the first surface, the conductive layers being located at the first surface and the second surface; and
a case which houses the multilayer printed wiring board, the case having an opening through which a region other than the conductive layer at the first surface of the printed wiring board is exposed, and covering the second surface of the multilayer printed wiring board.

9. The electronic device according to claim 8, wherein the case includes a case main body having a recess portion which houses the multilayer printed wiring board, and a mask connected to the case main body, and the mask has the opening and covers the conductive layer at the first surface.

10. The electronic device according to claim 8, wherein the conductive layer at the first surface is located in a peripheral portion of the first surface, and a region surrounded by the conductive layer is formed of only one of the insulating layer.

11. The electronic device according to claim 8, wherein the multilayer printed wiring board is formed by a build-up process, in which the insulating layers and the conductive layers are alternately stacked one by one.

12. The electronic device according to claim 11, wherein adjacent two of the conductive layers with an insulating layer interposed therebetween are electrically connected by a via, and the via is situated between the conductive layers to be connected without penetrating through the multilayer printed wiring board.

13. A method for manufacturing an electronic device comprising:
   preparing a multilayer printed wiring board including a plurality of insulating layers and a plurality of conductive layers, which are alternately stacked, the multilayer printed wiring board including:
      a flat surface located on one side of the multilayer printed wiring board along a stacked direction, the flat surface being formed of one of the insulating layers, the flat surface having a plurality of connection terminals arranged thereon, the connection terminals being electrically connected to the conductive layers; and
      an opposite surface located on the multilayer printed wiring board opposite to the flat surface;
   mounting circuit components on the opposite surface of the multilayer printed wiring board; and
   housing the multilayer printed wiring board in a case having an opening, the opening exposing the flat surface and the connection terminals from the case, and the case covering the opposite surface and the circuit components.

14. The method for manufacturing an electronic device according to claim 13, wherein the multilayer printed wiring board is formed by a build-up process, in which the insulating layers and the conductive layers are alternately stacked one by one, and contact terminals electrically connected to the conductive layers are located on the flat surface.

15. An electronic device comprising
   a multilayer printed wiring board including a plurality of insulating layers and a plurality of conductive layers, which are alternately stacked, the multilayer printed wiring board having a flat surface on one side thereof along a stacked direction and an opposite surface located opposite to the flat surface, the flat surface being formed of one of the insulating layers, each of the flat surface and the opposite surface being coated with a solder resist;
   a circuit component mounted on the opposite surface of the multilayer printed wiring board; and
   a case which houses the multilayer printed wiring board, the case having an opening that exposes at least a part of the flat surface.

* * * * *